(12) United States Patent
Khlat et al.

(10) Patent No.: US 11,588,449 B2
(45) Date of Patent: Feb. 21, 2023

(54) ENVELOPE TRACKING POWER AMPLIFIER APPARATUS

(71) Applicant: Qorvo US, Inc., Greensboro, NC (US)

(72) Inventors: Nadim Khlat, Cugnaux (FR); Arthur Nguyen, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 26 days.

(21) Appl. No.: 17/032,553

(22) Filed: Sep. 25, 2020

(65) Prior Publication Data

US 2022/0103137 A1 Mar. 31, 2022

(51) Int. Cl.
*H03F 1/30* (2006.01)
*H03F 3/195* (2006.01)
*H03F 3/20* (2006.01)

(52) U.S. Cl.
CPC ............ *H03F 3/195* (2013.01); *H03F 3/20* (2013.01); *H03F 2200/102* (2013.01); *H03F 2200/451* (2013.01)

(58) Field of Classification Search
CPC .................................. H03F 1/30; H03G 3/20
USPC ......................................... 330/297, 129, 136
See application file for complete search history.

(56) References Cited

U.S. PATENT DOCUMENTS

| | | | |
|---|---|---|---|
| 5,510,753 A | 4/1996 | French | |
| 5,838,732 A | 11/1998 | Carney | |
| 6,107,862 A | 8/2000 | Mukainakano et al. | |
| 6,141,377 A | 10/2000 | Sharper et al. | |
| 6,141,541 A | 10/2000 | Midya et al. | |
| 6,411,531 B1 | 6/2002 | Nork et al. | |
| 6,985,033 B1 | 1/2006 | Shirali et al. | |
| 7,043,213 B2 | 5/2006 | Robinson et al. | |
| 7,471,155 B1 | 12/2008 | Levesque | |
| 7,570,931 B2 | 8/2009 | McCallister et al. | |
| 7,994,862 B1 | 8/2011 | Pukhovski | |
| 8,461,928 B2 | 6/2013 | Yahav et al. | |
| 8,493,141 B2 | 7/2013 | Khlat et al. | |

(Continued)

FOREIGN PATENT DOCUMENTS

EP  3174199 A2  5/2012
JP  H03104422 A  5/1991

(Continued)

OTHER PUBLICATIONS

Quayle Action for U.S. Appl. No. 16/589,940, dated Dec. 4, 2020, 8 pages.

(Continued)

*Primary Examiner* — Henry Choe
(74) *Attorney, Agent, or Firm* — Withrow & Terranova, P.L.L.C.

(57) ABSTRACT

An envelope tracking (ET) power amplifier apparatus is provided. The ET power amplifier apparatus includes an amplifier circuit configured to amplify a radio frequency (RF) signal based on an ET voltage and a tracker circuit configured to generate the ET voltage based on an ET target voltage. The ET power amplifier apparatus also includes a control circuit. The control circuit is configured to dynamically determine a voltage standing wave ratio (VSWR) change at a voltage output relative to a nominal VSWR and cause an adjustment to the ET voltage. By dynamically determining the VSWR change and adjusting the ET voltage in response to the VSWR change, the amplifier circuit can operate under a required EVM threshold across all phase angles of the RF signal.

19 Claims, 7 Drawing Sheets

(56) References Cited

U.S. PATENT DOCUMENTS

| | | |
|---|---|---|
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,942,651 B2 | 1/2015 | Jones |
| 8,947,161 B2 | 2/2015 | Khlat et al. |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,900,204 B2 | 2/2018 | Levesque et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 10,862,431 B1 | 12/2020 | Khlat |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 2002/0167827 A1 | 11/2002 | Umeda et al. |
| 2003/0107428 A1 | 6/2003 | Khouri et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0052474 A1 | 3/2007 | Saito |
| 2007/0258602 A1 | 11/2007 | Vepsalainen et al. |
| 2008/0116960 A1 | 5/2008 | Nakamura |
| 2008/0231358 A1 | 9/2008 | Maemura |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0283534 A1 | 11/2010 | Pierdomenico |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Powers et al. |
| 2012/0200435 A1 | 8/2012 | Ngo et al. |
| 2012/0281597 A1 | 11/2012 | Khlat et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |

(56) References Cited

U.S. PATENT DOCUMENTS

| | | |
|---|---|---|
| 2017/0005619 A1 | 1/2017 | Khlat |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0127608 A1 | 4/2020 | Khlat |
| 2020/0127625 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0321848 A1 | 10/2020 | Khlat |
| 2020/0321917 A1 | 10/2020 | Nomiyama et al. |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0382061 A1 | 12/2020 | Khlat |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194515 A1 | 6/2021 | Go et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |

FOREIGN PATENT DOCUMENTS

| | | |
|---|---|---|
| WO | 2018182778 A1 | 10/2018 |
| WO | 2020206246 A1 | 10/2020 |
| WO | 2021016350 A1 | 1/2021 |
| WO | 2021046453 A1 | 3/2021 |

OTHER PUBLICATIONS

Notice of Allowance for U.S. Appl. No. 16/122,611, dated Jan. 13, 2021, 8 pages.

Notice of Allowance for U.S. Appl. No. 16/284,023, dated Jan. 19, 2021, 7 pages.

Notice of Allowance for U.S. Appl. No. 16/416,812, dated Feb. 16, 2021, 8 pages.

Non-Final Office Action for U.S. Appl. No. 16/689,236 dated Mar. 2, 2021, 15 pages.

Notice of Allowance for U.S. Appl. No. 16/435,940, dated Dec. 21, 2020, 7 pages.

Notice of Allowance for U.S. Appl. No. 16/774,060, dated Feb. 3, 2021, 7 pages.

Notice of Allowance for U.S. Appl. No. 16/590,790, dated Jan. 27, 2021, 7 pages.

Notice of Allowance for U.S. Appl. No. 16/661,061, dated Feb. 10, 2021, 7 pages.

Notice of Allowance for U.S. Appl. No. 16/122,611, dated Apr. 1, 2021, 8 pages.

Notice of Allowance for U.S. Appl. No. 16/689,236 dated Jun. 9, 2021, 7 pages.

Non-Final Office Action for U.S. Appl. No. 16/775,554, dated Jun. 14, 2021, 5 pages.

Non-Final Office Action for U.S. Appl. No. 16/582,471, dated Mar. 24, 2021, 11 pages.

Non-Final Office Action for U.S. Appl. No. 16/597,952, dated May 26, 2021, 7 pages.

Notice of Allowance for U.S. Appl. No. 16/582,471, dated Jun. 22, 2021, 9 pages.

Wan, F. et al., "Negative Group Delay Theory of a Four-Port RC-Network Feedback Operational Amplifier," IEEE Access, vol. 7, Jun. 13, 2019, IEEE, 13 pages.

Notice of Allowance for U.S. Appl. No. 16/834,049, dated Jun. 24, 2021, 8 pages.

Non-Final Office Action for U.S. Appl. No. 14/836,634, dated May 16, 2016, 9 pages.

Non-Final Office Action for U.S. Appl. No. 14/868,890, dated Jul. 14, 2016, 13 pages.

Non-Final Office Action for U.S. Appl. No. 15/792,909, dated May 18, 2018, 13 pages.

Notice of Allowance for U.S. Appl. No. 15/459,449, dated Mar. 28, 2018, 7 pages.

Notice of Allowance for U.S. Appl. No. 15/723,460, dated Jul. 24, 2018, 8 pages.

Notice of Allowance for U.S. Appl. No. 15/704,131, dated Jul. 17, 2018, 7 pages.

Notice of Allowance for U.S. Appl. No. 15/728,202, dated Aug. 2, 2018, 7 pages.

Non-Final Office Action for U.S. Appl. No. 15/888,300, dated Aug. 28, 2018, 11 pages.

Notice of Allowance for U.S. Appl. No. 15/792,909, dated Dec. 19, 2018, 11 pages.

Notice of Allowance for U.S. Appl. No. 15/993,705, mailed Oct. 31, 2018, 7 pages.

Pfister, Henry, "Discrete-Time Signal Processing," Lecture Note, pfister.ee.duke.edu/courses/ece485/dtsp.pdf, Mar. 3, 2017,22 pages.

Non-Final Office Action for U.S. Appl. No. 15/888,260, dated May 2, 2019, 14 pages.

Non-Final Office Action for U.S. Appl. No. 15/986,948, dated Mar. 28, 2019, 8 pages.

Non-Final Office Action for U.S. Appl. No. 16/018,426, dated Apr. 11, 2019, 11 pages.

Supplemental Notice of Allowability for U.S. Appl. No. 15/902,244, dated Mar. 20, 2019, 6 pages.

Notice of Allowance for U.S. Appl. No. 15/902,244, dated Feb. 8, 2019, 8 pages.

Advisory Action for U.S. Appl. No. 15/888,300, dated Jun. 5, 2019, 3 pages.

Notice of Allowance for U.S. Appl. No. 15/984,566, dated May 21, 2019, 6 pages.

Notice of Allowance for U.S. Appl. No. 16/150,556, dated Jul. 29, 2019, 7 pages.

(56) References Cited

OTHER PUBLICATIONS

Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, mailed Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, dated Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Notice of Allowance for U.S. Appl. No. 15/964,762, mailed Mar. 18, 2019, 7 pages.
Non-Final Office Action for U.S. Appl. No. 16/263,316, dated Dec. 23, 2019, 10 pages.
Final Office Action for U.S. Appl. No. 16/263,316, dated May 13, 2020, 10 pages.
Non-Final Office Action for U.S. Appl. No. 16/263,316, dated Jul. 17, 2020, 4 pages.
Non-Final Office Action for U.S. Appl. No. 16/263,316, dated Nov. 24, 2020, 4 pages.
Notice of Allowance for U.S. Appl. No. 16/263,316, dated Mar. 30, 2021, 7 pages.
Final Office Action for U.S. Appl. No. 16/807,575, dated May 4, 2022, 12 pages.
Chen, S. et al., "A 4.5 µW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, dated Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
International Search Report and Written Opinion for International Patent Application No. PCT/US2021/052151, dated Jan. 4, 2022, 16 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/054141 dated Jan. 25, 2022, 15 pages.
International Search Report and Written Opinion for International Patent Application No. PCT/US2021/052830, dated Jan. 24, 2022, 13 pages.
Advisory Action for U.S. Appl. No. 16/807,575, dated Jul. 28, 2022, 3 pages.
Notice of Allowance for U.S. Appl. No. 16/807,575, dated Aug. 19, 2022, 8 pages.
Notice of Allowance for U.S. Appl. No. 17/148,064, dated Aug. 18, 2022, 8 pages.
Non-Final Office Action for U.S. Appl. No. 17/163,642, dated Aug. 17, 2022, 9 pages.
Final Office Action for U.S. Appl. No. 17/073,764, dated Jun. 1, 2022, 22 pages.
Advisory Action for U.S. Appl. No. 17/073,764, dated Aug. 23, 2022, 3 pages.
Extended European Search Report for European Patent Application No. 22153526.3, dated Jul. 13, 2022, 9 pages.
International Preliminary Report on Patentability for International Patent Application No. PCT/US2021/052151, dated Oct. 13, 2022, 21 pages.
International Preliminary Report on Patentability for International Patent Application No. PCT/US2021/054141, dated Sep. 29, 2022, 20 pages.
Non-Final Office Action for U.S. Appl. No. 17/146,765, dated Sep. 7, 2022, 10 pages.
Final Office Action for U.S. Appl. No. 17/163,642, dated Nov. 25, 2022, 13 pages.
Non-Final Office Action for U.S. Appl. No. 17/073,764, dated Sep. 30, 2022, 13 pages.
Written Opinion for International Patent Application No. PCT/US2021/052830, dated Nov. 3, 2022, 7 pages.

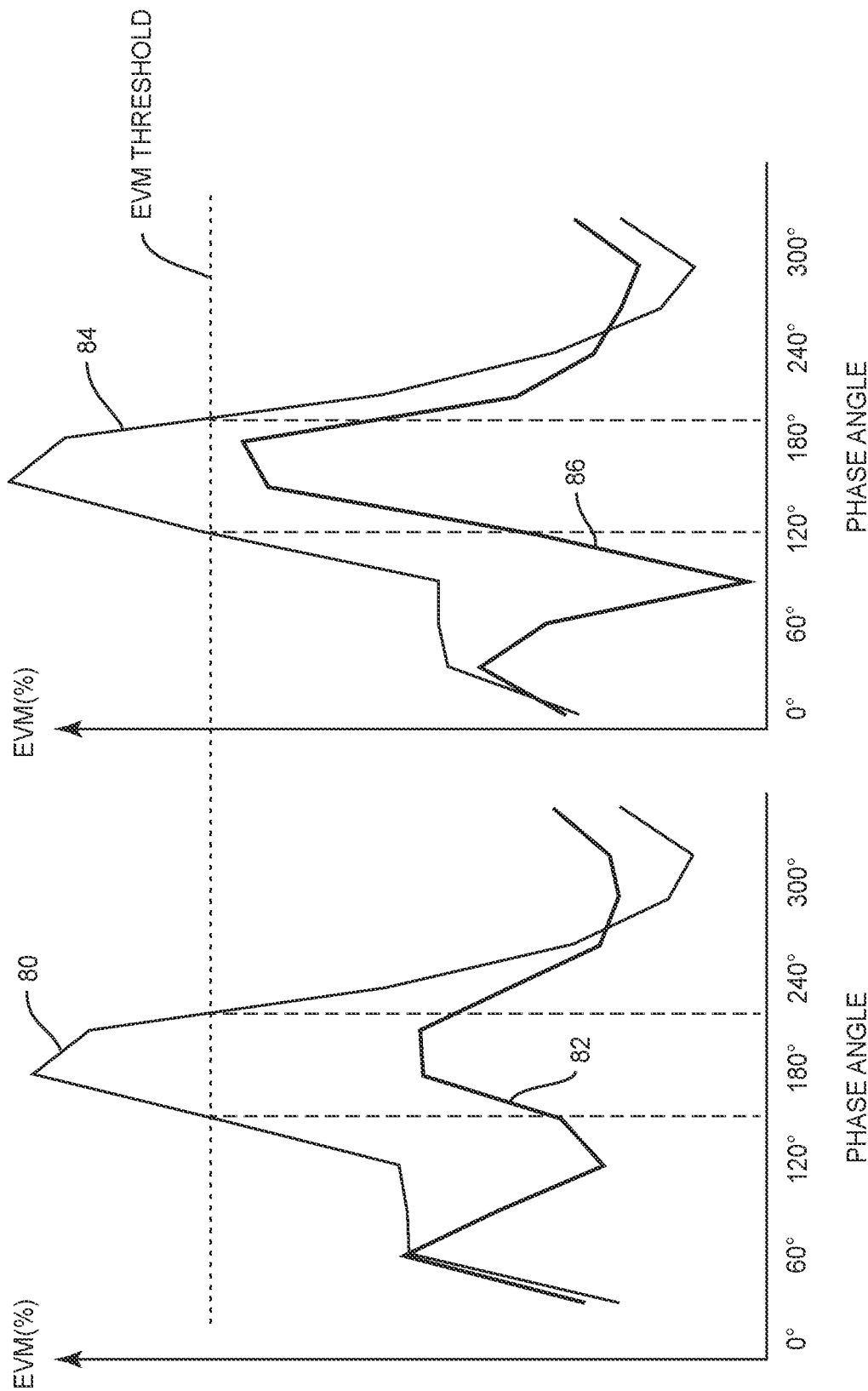

ENVELOPE TRACKING POWER AMPLIFIER APPARATUS

FIELD OF THE DISCLOSURE

The technology of the disclosure relates generally to envelope tracking (ET) power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltage applied to the PAs to ensure that the PAs are operating at a higher efficiency and under a required error vector magnitude (EVM) threshold (e.g., 17.5%) for a given instantaneous output power requirement of the RF signals.

SUMMARY

Aspects disclosed in the detailed description include an envelope tracking (ET) power amplifier apparatus. The ET power amplifier apparatus includes an amplifier circuit configured to amplify a radio frequency (RF) signal based on an ET voltage and a tracker circuit configured to generate the ET voltage based on an ET target voltage. Notably, the RF signal may be modulated across a wide modulation bandwidth and/or associated with various phase angles, which can dynamically change load impedance of the amplifier circuit. As a result, the amplifier circuit may experience a dynamic change in a voltage standing wave ratio (VSWR), which may cause the amplifier circuit to fail an error vector magnitude (EVM) requirement. In this regard, a control circuit is employed in the ET power amplifier apparatus to dynamically determine the VSWR change at a voltage output relative to a nominal VSWR and cause an adjustment to the ET voltage. By dynamically determining the VSWR change and adjusting the ET voltage in response to the VSWR change, the amplifier circuit can operate under a required EVM threshold across all phase angles of the RF signal.

In one aspect, an ET power amplifier apparatus is provided. The ET power amplifier apparatus includes a tracker circuit configured to generate an ET voltage at a voltage output based on an ET target voltage. The ET power amplifier apparatus also includes an amplifier circuit coupled to the voltage output and configured to amplify an RF signal based on the ET voltage. The ET power amplifier apparatus also includes a control circuit. The control circuit is configured to determine a VSWR at the voltage output. The control circuit is also configured to cause an adjustment to the ET target voltage if the VSWR at the voltage output is different from a nominal VSWR.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIGS. 4A and 4B are graphic diagrams providing exemplary illustrations of error vector magnitude (EVM) improvements that may be achieved by the ET power amplifier apparatus of FIG. 2;

DETAILED DESCRIPTION

Figure 1:
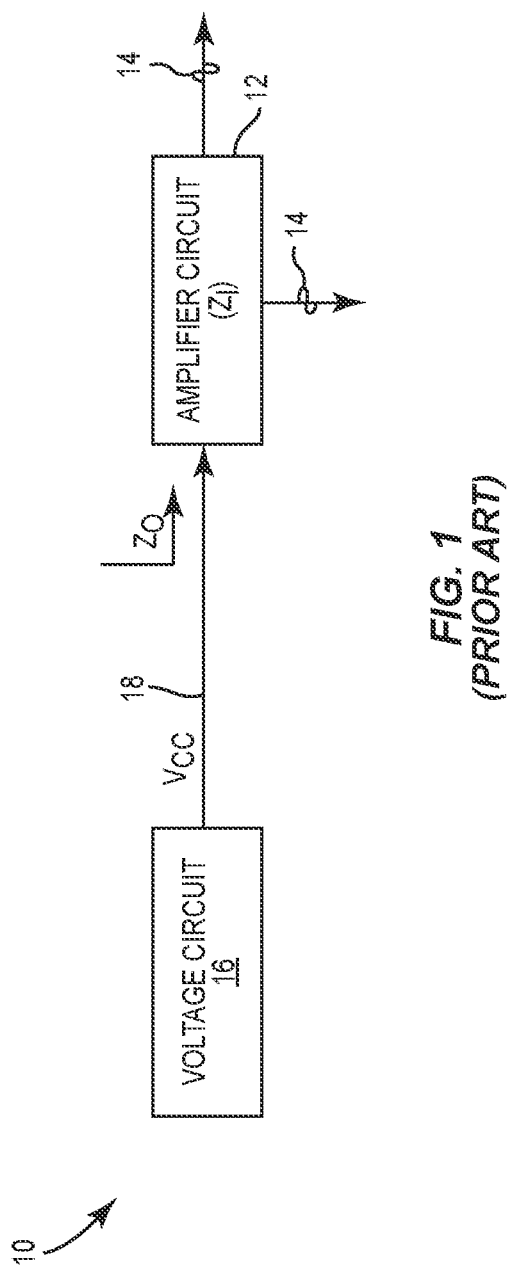
FIG. 1 is a schematic diagram providing an exemplary illustration of factors that cause a voltage standing wave ratio (VSWR) change in a conventional envelope tracking (ET) amplifier apparatus.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) power amplifier apparatus. The ET power amplifier apparatus includes an amplifier circuit configured to amplify a radio frequency (RF) signal based on an ET voltage and a tracker circuit configured to generate the ET voltage based on an ET target voltage. Notably, the RF signal may be modulated across a wide modulation bandwidth and/or associated with various phase angles, which can dynamically change load impedance of the amplifier circuit. As a result, the amplifier circuit may experience a dynamic change in voltage standing wave ratio (VSWR), which may cause the amplifier circuit to fail an error vector magnitude (EVM) requirement. In this regard, a control circuit is employed in the ET power amplifier apparatus to dynamically determine the VSWR change at a voltage output relative to a nominal VSWR and cause an adjustment to the ET voltage. By dynamically determining the VSWR change and adjusting the ET voltage in response to the VSWR change, the amplifier circuit can operate under a required EVM threshold across all phase angles of the RF signal.

Figure 2:
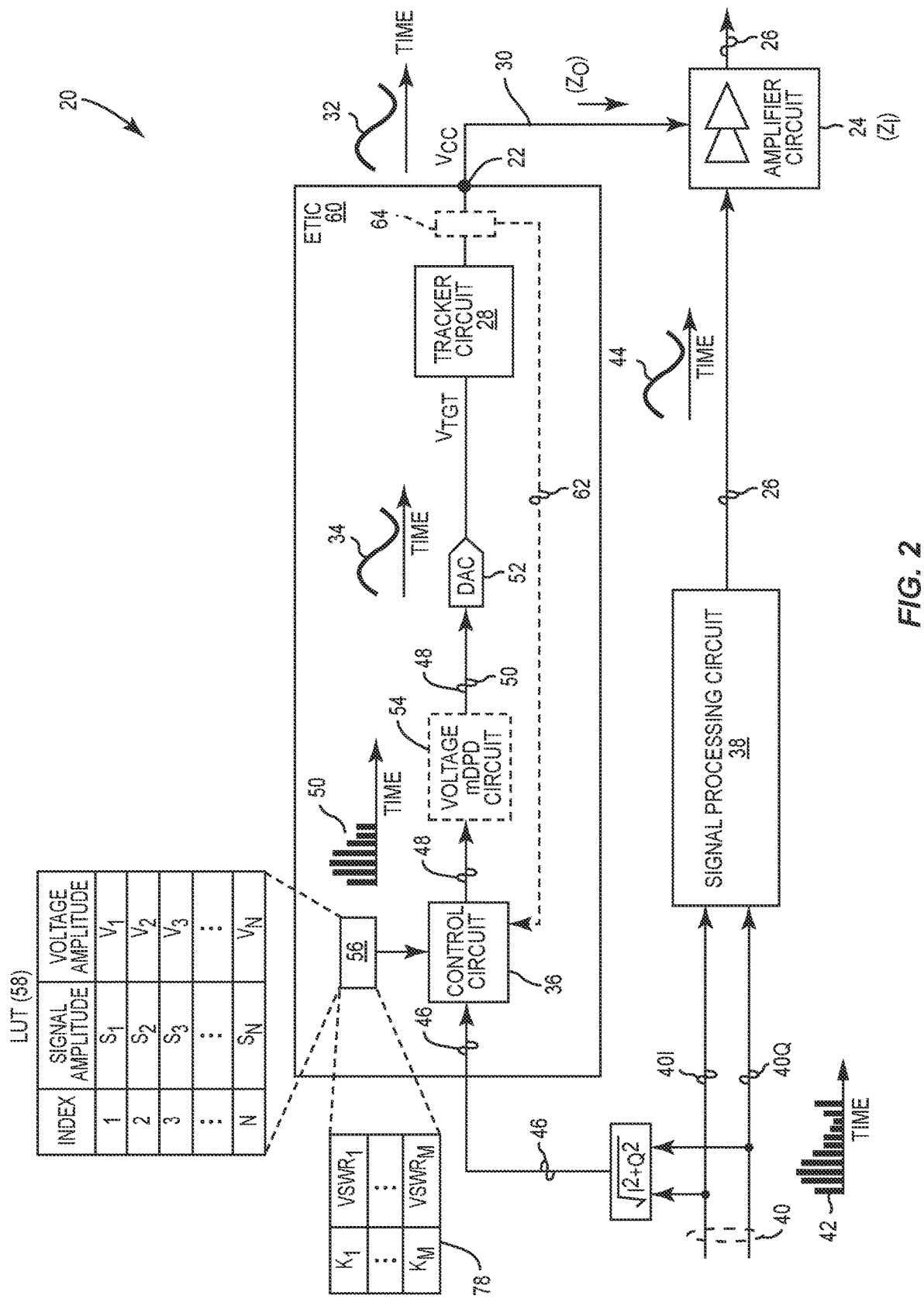
FIG. 2 is a schematic diagram of an exemplary ET power amplifier apparatus configured according to an embodiment of the present disclosure to dynamically detect and respond to a VSWR change at a voltage output.

Before discussing the ET power amplifier apparatus of the present disclosure, starting at FIG. 2, a brief overview of VSWR is first provided with reference to FIG. 1.

FIG. 1 is a schematic diagram providing an exemplary illustration of factors that cause a VSWR change in a conventional ET power amplifier apparatus 10. The conventional ET power amplifier apparatus 10 includes an amplifier circuit 12 configured to amplify an RF signal 14 based on an ET voltage $V_{CC}$. The conventional ET power amplifier apparatus 10 includes a voltage circuit 16 coupled to the amplifier circuit 12 via a voltage line 18. The voltage circuit 16 is configured to generate the ET voltage $V_{CC}$ and provide the ET voltage $V_{CC}$ to the amplifier circuit 12 via the voltage line 18.

In a non-limiting example, the amplifier circuit 12 has an inherent load impedance $Z_L$ and the voltage circuit 16 and the voltage line 18 collectively present a source impedance $Z_O$ to the amplifier circuit 12. For the voltage circuit 16 to efficiently deliver the ET voltage $V_{CC}$ to the amplifier circuit 12, the source impedance $Z_O$ should be well matched with the load impedance $Z_L$. In this regard, a VSWR, as shown in the equation (Eq. 1) below, is a measure that numerically describes how well the source impedance $Z_O$ matches the load impedance $Z_L$.

$$VSWR=(1+|\Gamma|)/(1-|\Gamma|)$$

$$\Gamma=(Z_L-Z_O)/(Z_L+Z_O) \qquad (Eq.\ 1)$$

In the equations above, $\Gamma$ represents a reflection coefficient that is a function of the load impedance $Z_L$ and the source impedance $Z_O$. If the source impedance $Z_O$ is well matched to the load impedance $Z_L$ ($Z_O=Z_L$), there will be no power reflection between the amplifier circuit 12 and the voltage circuit 16. As such, the reflection coefficient $\Gamma$ would be zero (0) and the VSWR would be equal to one-to-one (1:1). Hereinafter, the VSWR of 1:1 is referred to as a nominal VSWR. As a result, the ET voltage $V_{CC}$ may be delivered to the amplifier circuit 12 without an amplitude distortion.

In contrast, if the source impedance $Z_O$ is not well matched to the load impedance $Z_L$ ($Z_O \neq Z_L$), there will be a power reflection from the amplifier circuit 12 to the voltage circuit 16. As such, the reflection coefficient $\Gamma$ will be greater than zero and less than one (0<$\Gamma$<1) and the VSWR will be different from the nominal VSWR (e.g., 2:1, 3:1, etc.). As a result, the amplifier circuit 12 may receive the ET voltage with a distorted voltage amplitude.

Many factors can contribute to a mismatch between the source impedance $Z_O$ and the load impedance $Z_L$ after the factory calibration. For example, the RF signal 14 can be modulated in a wide modulation bandwidth (e.g., >200 MHz) and/or be associated with various phase angles (e.g., for RF beamforming). The wide modulation bandwidth and/or the various phase angles may dynamically change the load impedance $Z_L$ and, thus, the VSWR. As a result, the amplifier circuit 12 may operate with lower efficiency and higher EVM. As such, it may be desirable to dynamically detect the VSWR change and correct the ET voltage $V_{CC}$ accordingly.

In this regard, FIG. 2 is a schematic diagram of an exemplary ET power amplifier apparatus 20 configured according to an embodiment of the present disclosure to dynamically detect and respond to a VSWR change at a voltage output 22. The ET power amplifier apparatus 20 includes an amplifier circuit 24 coupled to the voltage output 22. The amplifier circuit 24 is configured to amplify an RF signal 26 based on an ET voltage $V_{CC}$. The ET power amplifier apparatus 20 includes a tracker circuit 28 coupled to the voltage output 22 via a voltage line 30. The tracker circuit 28 is configured to generate the ET voltage $V_{CC}$ at the voltage output 22 based on an ET target voltage $V_{TGT}$. By generating the ET voltage $V_{CC}$ based on the ET target voltage $V_{TGT}$, the ET voltage $V_{CC}$ will have a time-variant voltage envelope 32 that tracks (rises and falls) a time-variant target voltage envelope 34 of the ET target voltage $V_{TGT}$. As such, it is possible to adjust the ET voltage $V_{CC}$ by modifying the ET target voltage $V_{TGT}$.

The amplifier circuit 24 has an inherent load impedance $Z_L$. The tracker circuit 28 and the voltage line 30, on the other hand, collectively represent a source impedance $Z_O$ to the amplifier circuit 24. In this regard, the VSWR at the voltage output 22 is a function of the source impedance $Z_O$ and the load impedance $Z_L$, as shown in the equation (Eq. 1) above.

The ET power amplifier apparatus 20 may have been calibrated (e.g., at factory) to have the load impedance $Z_L$ substantially matching the source impedance $Z_O$. As a result of the calibration, the VSWR at the voltage output 22 can be substantially equal to the nominal VSWR. However, as the RF signal 26 may be modulated in a wide modulation bandwidth and/or in various phase angles, the load impedance $Z_L$ and, consequently, the VSWR may change dynamically.

In this regard, the ET power amplifier apparatus 20 further includes a control circuit 36, which can be a field-programmable gate array (FPGA), as an example. As discussed in detail below, the control circuit 36 is configured to dynamically determine whether a VSWR at the voltage output 22 is identical to or different from the nominal VSWR. If the determined VSWR at the voltage output 22 is different from the nominal VSWR, the control circuit 36 is configured to cause an adjustment to the ET target voltage $V_{TGT}$. As a result of adjusting the ET target voltage $V_{TGT}$, the ET voltage $V_{CC}$ will be modified at the voltage output 22. In contrast, if the determined VSWR is identical to the nominal VSWR, the control circuit 36 is configured not to cause the adjustment to the ET target voltage. As a result, the ET voltage will not be modified at the voltage output 22. By dynamically determining the VSWR change and adjusting the ET voltage $V_{CC}$ in response to the VSWR change, the amplifier circuit 24 can operate under a required EVM threshold (e.g., <10%) across all phase angles of the RF signal 26.

In a non-limiting example, the ET power amplifier apparatus 20 includes a signal processing circuit 38, which can be an FPGA, as an example. The signal processing circuit 38 receives a digital signal 40 having a number of power amplitudes 42. The signal processing circuit 38 is configured to convert the digital signal 40 into the RF signal 26. In this regard, the RF signal 26 will have a time-variant power envelope 44 that rises and falls according to the power amplitudes 42. In other words, the time-variant power envelope 44 is defined by the power amplitudes 42.

The digital signal 40 may be modulated to include a digital in-phase signal 40I, which corresponds to a number of in-phase amplitudes (I), and a digital quadrature signal 40Q, which corresponds to a number of quadrature amplitudes (Q). The in-phase amplitudes (I) and the quadrature amplitudes (Q) collectively define a number of signal amplitudes 46 that tracks the power amplitudes 42. In a non-limiting example, each of the signal amplitudes 46 can be equal to $\sqrt{I^2+Q^2}$. The control circuit 36 is configured to generate a digital target voltage signal 48 based on the signal amplitudes 46. As such, the digital target voltage signal 48 will be associated with a number of voltage amplitudes 50 each corresponding to a respective one of the signal amplitudes 46.

The ET power amplifier apparatus 20 includes a voltage digital-to-analog converter (DAC) 52 configured to convert the digital target voltage signal 48 into the ET target voltage $V_{TGT}$. Accordingly, the time-variant target voltage envelope 34 associated with the ET target voltage $V_{TGT}$ will track the voltage amplitudes 50. In this regard, the control circuit 36 may simply modify the voltage amplitudes 50 to cause the ET target voltage $V_{TGT}$ to be modified. More specifically, the control circuit 36 modifies the voltage amplitudes 50 if the VSWR at the voltage output 22 is different from the nominal VSWR. In contrast, the control circuit 36 does not modify the voltage amplitudes 50 if the VSWR at the voltage output 22 is identical to the nominal VSWR.

Given that the control circuit 36 modifies the voltage amplitudes 50 before the voltage DAC converts the voltage amplitudes 50 into the ET target voltage $V_{TGT}$, the control circuit 36 is said to adjust the ET target voltage $V_{TGT}$ in a digital domain. However, it should be appreciated that the control circuit 36 may also adjust the ET target voltage $V_{TGT}$ in an analog domain. Furthermore, it may also be possible to concurrently adjust the voltage amplitudes 50 in the digital domain and the ET target voltage $V_{TGT}$ in the analog domain.

The ET power amplifier apparatus 20 may also include a voltage memory digital pre-distortion (mDPD) circuit 54 configured to digitally pre-distort the voltage amplitudes 50 to help mitigate a so-called "memory effect" in the tracker circuit 28 and/or the amplifier circuit 24. Herein, the "memory effect" refers to a phenomenon wherein the ET voltage $V_{CC}$ generated by the tracker circuit 28 depends not only on the ET target voltage $V_{TGT}$ at present, but also the ET target voltage $V_{TGT}$ in the past.

The ET power amplifier apparatus 20 may include a memory circuit 56, which can be any type of hardware-based memory such as random-access memory (RAM), read-only memory (ROM), flash, etc. The memory circuit 56 may store a look-up table (LUT) 58. In a non-limiting example, the LUT 58 includes an index column (denoted as "Index"), a signal amplitude column (denoted as "Signal Amplitude"), and a voltage amplitude column (denoted as "Voltage Amplitude"). The signal amplitude column is configured to store the signal amplitudes 46 and the voltage amplitude column is configured to store the voltage amplitudes 50. In this regard, the LUT 58 can be used to correlate the signal amplitudes 46 to the voltage amplitudes 50. Accordingly, the control circuit 36 may retrieve any of the voltage amplitudes 50 from the voltage amplitude column based on a respective one of the signal amplitudes 46 in the signal amplitude column.

In a non-limiting example, the LUT 58 can be populated during factory calibration or via an over-the-air (OTA) update. Each of the voltage amplitudes 50 in the voltage amplitude column may be determined to correspond to the nominal VSWR. As such, the voltage amplitudes 50 stored in the LUT 58 may also be referred to as nominal voltage amplitudes. In a non-limiting example, the tracker circuit 28, the control circuit 36, the DAC 52, the voltage mDPD circuit 54, and/or the memory circuit 56 can be integrated into an ET integrated circuit (ETIC) 60.

The control circuit 36 may determine whether the VSWR at the voltage output 22 is identical to or different from the nominal VSWR in a number of ways. In one embodiment, the control circuit may determine the VSWR at the voltage output based on a sense signal 62. The ET power amplifier apparatus 20 may include a coupler circuit 64 coupled to the voltage output 22. The coupler circuit 64 may be configured to generate the sense signal 62 that indicates the VSWR at the voltage output 22. Alternatively, the control circuit 36 may be configured to calculate the VSWR at the voltage output 22 based on an estimated load impedance of the amplifier circuit 24. It should be appreciated that there may be other methods by means of which the control circuit 36 can determine the VSWR at the voltage output 22 and, thus, determine whether the VSWR has changed relative to the nominal VSWR.

When the control circuit 36 determines that the VSWR at the voltage output 22 is different from the nominal VSWR, the control circuit 36 may cause the ET target voltage $V_{TGT}$ to be adjusted in a number of ways. Specific embodiments for adjusting the ET target voltage $V_{TGT}$ are discussed below.

In one embodiment, the control circuit 36 may modify the voltage amplitudes 50 as a function of a scaling factor K and a minimum of the voltage amplitudes 50 in the LUT 58, as shown in equation (Eq. 2) below.

$$VA_M = K^*(V_{TGT-nominal} - V_{TGT-MIN}) + V_{TGT-MIN} \quad \text{(Eq. 2)}$$

In the equation (Eq. 2) above, $VA_M$ represents any one of the voltage amplitudes 50 that is modified by the control circuit 36, K represents the scaling factor, $V_{TGT-nominal}$ represents a respective one of the voltage amplitudes 50 in the LUT 58, and $V_{TGT-MIN}$ represents the minimum of the voltage amplitudes 50 in the LUT 58.

Figure 3A:
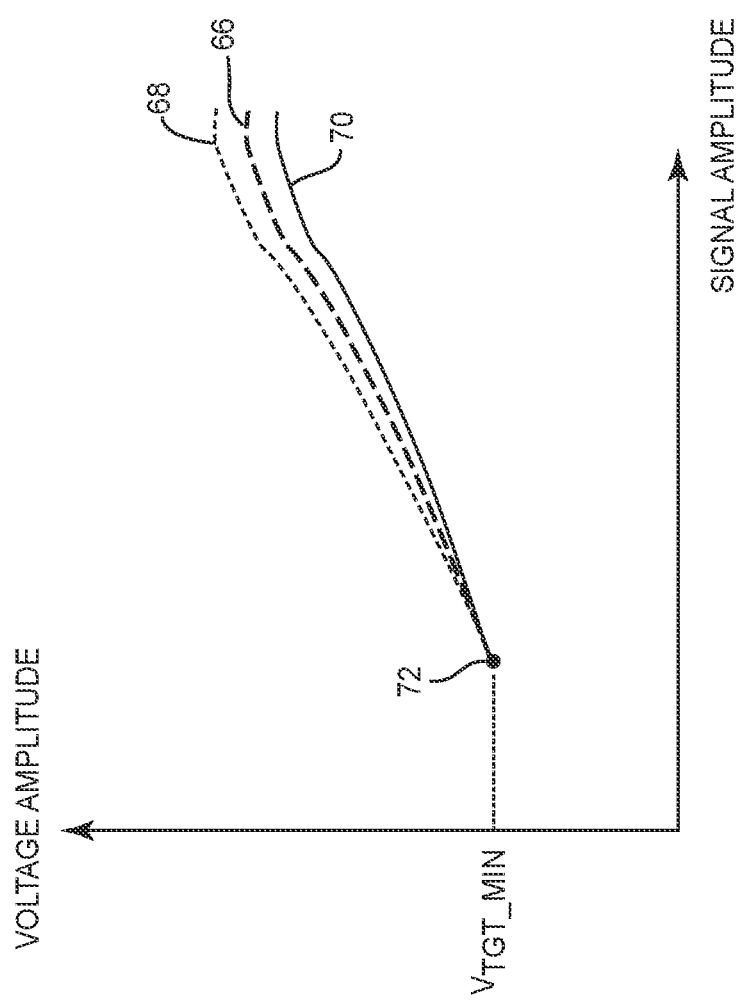
FIG. 3A is a graphic diagram providing an exemplary illustration of a method for responding to the VSWR change according to one embodiment of the present disclosure.

FIG. 3A is a graphic diagram providing an exemplary illustration of the equation (Eq. 2) that may be employed by the control circuit 36 for modifying the voltage amplitudes 50. FIG. 3A illustrates a first target voltage curve 66, a second target voltage curve 68, and a third target voltage curve 70. The first target voltage curve 66 represents the nominal voltage amplitudes 50 stored in the LUT 58, which corresponds to the nominal VSWR. The second target voltage curve 68 represents the voltage amplitudes 50 modified based on the equation (Eq. 2) with the scaling factor K being greater than one (K>1). The third target voltage curve 70 represents the voltage amplitudes 50 modified based on the equation (Eq. 2) with the scaling factor K being less than one (K<1). As shown in FIG. 3A, all of the first target voltage curve 66, the second target voltage curve 68, and the third target voltage curve 70 are anchored by a pivot point 72 set by the $V_{TGT-MIN}$.

Figure 3B:
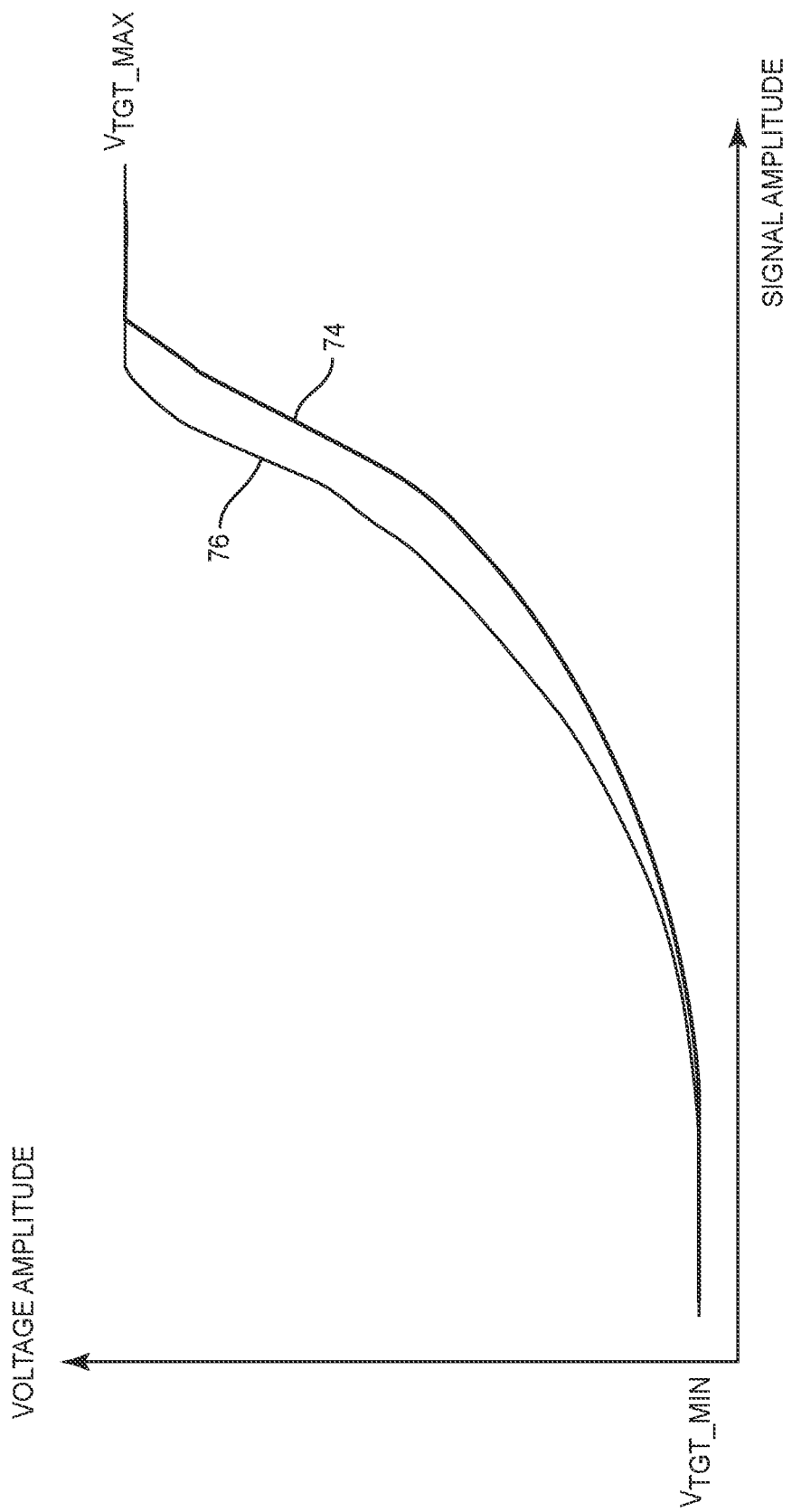
FIG. 3B is a graphic diagram providing another illustration of the method for responding to the VSWR change as shown in FIG. 3A.

FIG. 3B is a graphic diagram providing another exemplary illustration of the equation (Eq. 2). FIG. 3B illustrates a first target voltage curve 74 and a second target voltage curve 76. The first target voltage curve 74 represents the nominal voltage amplitudes 50 stored in the LUT 58, which corresponds to the nominal VSWR. The second target voltage curve 76 represents the voltage amplitudes 50 modified based on the equation (Eq. 2) with the scaling factor K being greater than one (K>1). As shown in FIG. 3B, the control circuit 36 can be configured to cap each of the modified voltage amplitudes at a maximum ($V_{TGT-MAX}$) of the voltage amplitudes 50 stored in the LUT 58.

With reference back to FIG. 2, the control circuit 36 may determine the scaling factor K based on a scaling factor LUT 78, which can be stored in the memory circuit 56. In a non-limiting example, the scaling factor LUT 78 may store one or more scaling factors $K_1$-$K_M$ that correspond to one or more VSWRs $VSWR_1$-$VSWR_M$. In this regard, the control circuit 36 may be configured to retrieve a corresponding one of the scaling factors $K_1$-$K_M$ based on the VSWR at the voltage output, which is among the VSWRs $VSWR_1$-$VSWR_M$.

By dynamically determining the VSWR change at the voltage output 22 and adjusting the ET voltage $V_{TGT}$ in response to the VSWR change, the amplifier circuit 24 can operate under a required EVM threshold (e.g., 10%) across all phase angles of the RF signal 26. In this regard, FIGS. 4A and 4B are graphic diagrams providing exemplary illustrations of EVM improvements that may be achieved by the ET power amplifier apparatus 20 of FIG. 2.

FIG. 4A presents a first EVM curve 80 that illustrates EVM performance of the amplifier circuit 24 when the VSWR at the voltage output 22 equals the nominal VSWR (1:1). FIG. 4A also presents a second EVM curve 82 that illustrates EVM performance of the amplifier circuit 24 when the VSWR at the voltage output 22 equals 2:1 and the scaling factor K in the equation (Eq. 2) equals 1.3.

As shown in FIG. 4A, the first EVM curve 80 shows that, without adjusting the ET voltage $V_{TGT}$ in response to the VSWR change at the voltage output 22, the EVM of the amplifier circuit 24 can exceed the EVM threshold when the RF signal 26 is associated with certain phase angles (e.g., approximately 120°-180°). In contrast, the second EVM curve 82 shows that, by adjusting the ET voltage $V_{TGT}$ in response to the VSWR change at the voltage output 22, the EVM of the amplifier circuit 24 remains under the EVM threshold independent of the phase angles of the RF signal 26.

FIG. 4B presents a third EVM curve 84 that illustrates EVM performance of the amplifier circuit 24 when the VSWR at the voltage output 22 equals the nominal VSWR (1:1). FIG. 4B also presents a fourth EVM curve 86 that illustrates EVM performance of the amplifier circuit 24 when the VSWR at the voltage output 22 equals 3:1 and the scaling factor K in the equation (Eq. 2) equals 1.3.

As shown in FIG. 4B, the third EVM curve 84 shows that, without adjusting the ET voltage $V_{TGT}$ in response to the VSWR change at the voltage output 22, the EVM of the amplifier circuit 24 can exceed the EVM threshold when the RF signal 26 is associated with certain phase angles (e.g., approximately 120°-180°). In contrast, the fourth EVM curve 86 shows that, by adjusting the ET voltage $V_{TGT}$ in response to the VSWR change at the voltage output 22, the EVM of the amplifier circuit 24 remains under the EVM threshold independent of the phase angles of the RF signal 26.

With reference back to FIG. 2, in another embodiment, the control circuit 36 may modify the voltage amplitudes 50 as a function of the scaling factor K and a root-mean-square (RMS) of the voltage amplitudes 50 in the LUT 58, as shown in equation (Eq. 3) below.

$$VA_M = K^*(V_{TGT-nominal} - V_{TGT-MIN}) + V_{TGT-RMS} \quad \text{(Eq. 3)}$$

In the equation (Eq. 3) above, $VA_M$ represents any one of the voltage amplitudes 50 that is modified by the control circuit 36, K represents the scaling factor, $V_{TGT-nominal}$ represents a respective one of the voltage amplitudes 50 in the LUT 58, and $V_{TGT-RMS}$ represents the RMS of the voltage amplitudes 50 in the LUT 58.

Figure 5:
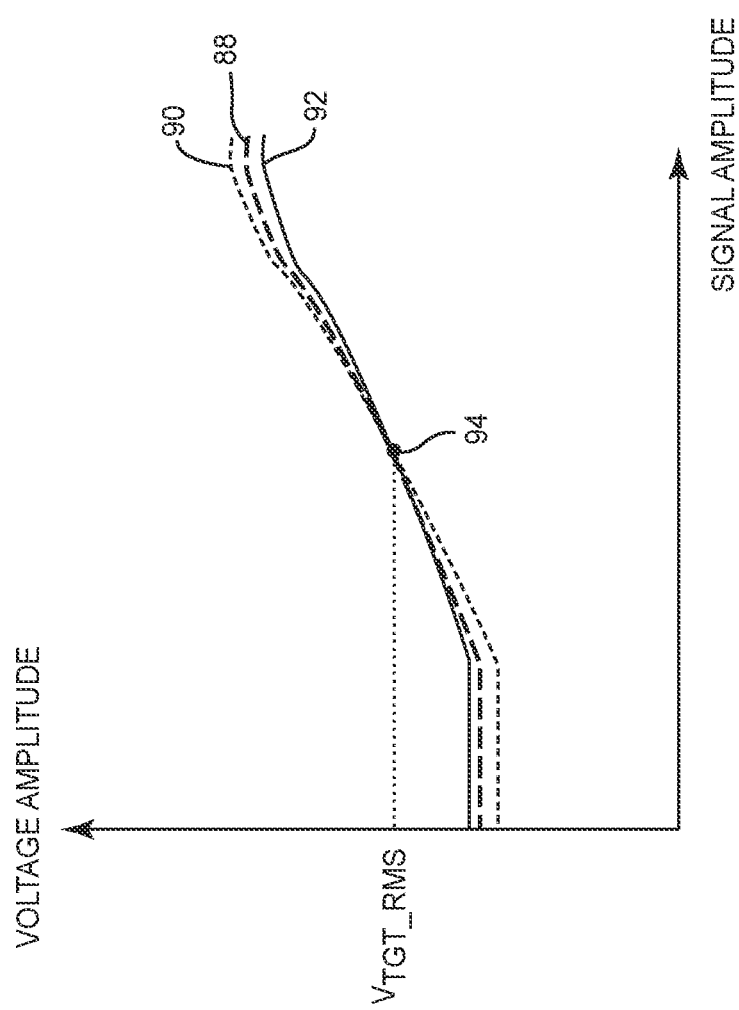
FIG. 5 is a graphic diagram providing an exemplary illustration of a method responding to the VSWR change according to another embodiment of the present disclosure.

FIG. 5 is a graphic diagram providing an exemplary illustration of the equation (Eq. 3) that may be employed by the control circuit 36 for modifying the voltage amplitudes 50. FIG. 5 illustrates a first target voltage curve 88, a second target voltage curve 90, and a third target voltage curve 92. The first target voltage curve 88 represents the nominal voltage amplitudes 50 stored in the LUT 58, which corresponds to the nominal VSWR. The second target voltage curve 90 represents the voltage amplitudes 50 modified based on the equation (Eq. 3) with the scaling factor K being greater than one (K>1). The third target voltage curve 92 represents the voltage amplitudes 50 modified based on the equation (Eq. 3) with the scaling factor K being less than one (K<1). As shown in FIG. 5, all of the first target voltage curve 88, the second target voltage curve 90, and the third target voltage curve 92 are anchored by a pivot point 94 set by the $V_{TGT-RMS}$.

With reference back to FIG. 2, in yet another embodiment, the control circuit 36 may modify the voltage amplitudes 50 as a function of the scaling factor K and a selected one of the voltage amplitudes 50 in the LUT 58 that is greater than the $V_{TGT-MIN}$ but less than the $V_{TGT-RMS}$, as shown in equation (Eq. 4) below.

$$VA_M = K*(V_{TGT-nominal} - V_{TGT-MIN}) + V_{TGT-SEL} \quad (Eq. 4)$$

In the equation (Eq. 3) above, $VA_M$ represents any one of the voltage amplitudes 50 that is modified by the control circuit 36, K represents the scaling factor, $V_{TGT-nominal}$ represents a respective one of the voltage amplitudes 50 in the LUT 58, and $V_{TGT-SEL}$ represents the selected one of the voltage amplitudes 50 in the LUT 58 ($V_{TGT-MIN} < V_{TGT-SEL} < V_{TGT-RMS}$).

Figure 6:
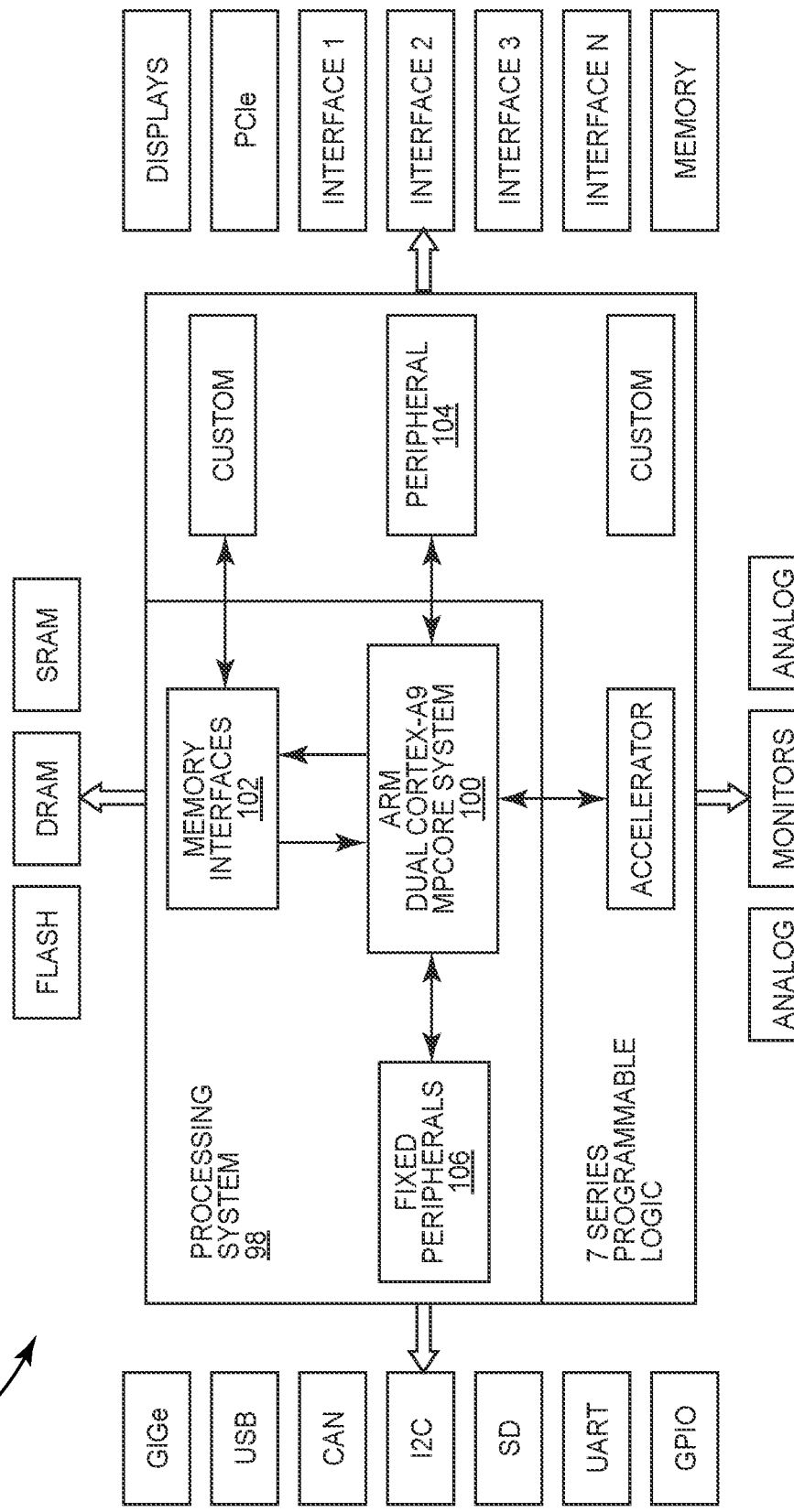
FIG. 6 is a block diagram of a Xilinx Zynq-7000 programmable system that can be provided as a control circuit in the ET power amplifier apparatus of FIG. 2 to dynamically detect and respond to the VSWR change at the voltage output.

As previously mentioned, the control circuit 36 may be an FPGA. In this regard, FIG. 6 is a block diagram of a Xilinx Zynq-7000 programmable system 96, which is an FPGA and can be provided as the control circuit 36 in the ET power amplifier apparatus 20 of FIG. 2 to dynamically detect and respond to the VSWR change at the voltage output 22. The programmable system 96 includes a processing system 98. The processing system 98 includes a microprocessor 100, a memory interface 102, a peripheral interface 104, and a fixed peripheral interface 106. In a non-limiting example, the memory interface 102 can be coupled to the memory circuit 56 to access the LUT 58, the peripheral interface 104 can be coupled to the coupler circuit 64 coupled to the voltage output 22, and the fixed peripheral interface 106 can be coupled to the DAC 52 and/or the tracker circuit 28. The coupler circuit 64 may be configured to generate the sense signal 62 that indicates the VSWR at the voltage output 22. Accordingly, the microprocessor 100 may determine the VSWR at the voltage output 22 based on the sense signal 62 or compute the VSWR at the voltage output 22 based on the equation (Eq. 1) and the estimated load impedance of the amplifier circuit 24. Accordingly, the microprocessor 100 may determine that the VSWR at the voltage output 22 is different from the nominal VSWR and cause the ET target voltage $V_{TGT}$ to be adjusted.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) power amplifier apparatus comprising:
   a tracker circuit configured to generate an ET voltage at a voltage output based on an ET target voltage;
   an amplifier circuit coupled to the voltage output and configured to amplify a radio frequency (RF) signal based on the ET voltage; and
   a control circuit configured to:
      determine a voltage standing wave ratio (VSWR) at the voltage output;
      cause an adjustment to the ET target voltage if the VSWR at the voltage output is different from a nominal VSWR; and
      cause the adjustment to the ET target voltage if the VSWR at the voltage output is identical to the nominal VSWR.

2. The ET power amplifier apparatus of claim 1 wherein the control circuit is further configured to cause the adjustment to the ET target voltage such that the amplifier circuit can operate under an error vector magnitude (EVM) threshold independent of a phase angle of the RF signal.

3. The ET power amplifier apparatus of claim 1 wherein the control circuit is further configured to:
   receive a plurality of signal amplitudes corresponding to a time-variant power envelope of the RF signal;
   determine a plurality of voltage amplitudes each corresponding to a respective one of the plurality of signal amplitudes; and
   modify the plurality of voltage amplitudes if the VSWR at the voltage output is different from the nominal VSWR.

4. The ET power amplifier apparatus of claim 3 wherein the control circuit is further configured not to modify the plurality of voltage amplitudes if the VSWR at the voltage output is identical to the nominal VSWR.

5. The ET power amplifier apparatus of claim 3 further comprising a voltage digital-to-analog converter (DAC) configured to convert the plurality of voltage amplitudes into the ET target voltage.

6. The ET power amplifier apparatus of claim 3 further comprising a look-up table (LUT) configured to correlate the plurality of signal amplitudes to the plurality of voltage amplitudes, wherein the control circuit is further configured to retrieve the plurality of voltage amplitudes from the LUT based on the plurality of signal amplitudes.

7. The ET power amplifier apparatus of claim 6 wherein the plurality of voltage amplitudes in the LUT is determined to correspond to the nominal VSWR.

8. The ET power amplifier apparatus of claim 6 wherein the control circuit is further configured to modify the plurality of voltage amplitudes as a function of a scaling factor and a minimum of the plurality of voltage amplitudes in the LUT.

9. The ET power amplifier apparatus of claim 8 further comprising a scaling factor LUT configured to correlate one or more scaling factors with one or more VSWRs, wherein the control circuit is further configured to retrieve the scaling factor among the one or more scaling factors based on the VSWR at the voltage output.

10. The ET power amplifier apparatus of claim 8 wherein the control circuit is further configured to modify each of the plurality of voltage amplitudes as being equal to: $K*(V_{TGT-nominal} - V_{TGT-MIN}) + V_{TGT-MIN}$, wherein:
   K represents the scaling factor;
   $V_{TGT-nominal}$ represents a respective one of the plurality of voltage amplitudes in the LUT; and $V_{TGT-MIN}$ represents the minimum of the plurality of voltage amplitudes in the LUT.

11. The ET power amplifier apparatus of claim 5 wherein the control circuit is further configured to cap each of the plurality of modified voltage amplitudes at a maximum of the plurality of voltage amplitudes.

12. The ET power amplifier apparatus of claim 6 wherein the control circuit is further configured to modify the plurality of voltage amplitudes as a function of a scaling factor and a root-mean-square (RMS) of the plurality of voltage amplitudes in the LUT.

13. The ET power amplifier apparatus of claim 12 wherein the control circuit is further configured to modify each of the plurality of voltage amplitudes as being equal to: $K*(V_{TGT-nominal} - V_{TGT-RMS}) + V_{TGT-RMS}$, wherein:

K represents the scaling factor;

$V_{TGT-nominal}$ represents a respective one of the plurality of voltage amplitudes in the LUT; and $V_{TGT-RMS}$ represents the RMS of the plurality of voltage amplitudes in the LUT.

14. The ET power amplifier apparatus of claim 12 wherein the control circuit is further configured to cap each of the plurality of modified voltage amplitudes at a maximum of the plurality of voltage amplitudes.

15. The ET power amplifier apparatus of claim 6 wherein the control circuit is further configured to modify the plurality of voltage amplitudes as a function of a scaling factor and a selected one of the plurality of voltage amplitudes in the LUT, wherein the selected one of the plurality of voltage amplitudes is greater than a minimum of the plurality of voltage amplitudes in the LUT and less than a root-mean-square (RMS) of the plurality of voltage amplitudes in the LUT.

16. The ET power amplifier apparatus of claim 1 wherein the control circuit is further configured to determine the VSWR at the voltage output based on a sense signal.

17. The ET power amplifier apparatus of claim 16 further comprising a coupler circuit coupled to the voltage output and configured to generate the sense signal to indicate the VSWR at the voltage output.

18. The ET power amplifier apparatus of claim 1 wherein the control circuit is further configured to calculate the VSWR at the voltage output based on an estimated load impedance of the amplifier circuit.

19. The ET power amplifier apparatus of claim 1 wherein the control circuit and the tracker circuit are integrated into an ET integrated circuit (ETIC).

* * * * *